(12) United States Patent
Huang et al.

(10) Patent No.: US 12,131,953 B2
(45) Date of Patent: Oct. 29, 2024

(54) SEMICONDUCTOR STRUCTURE HAVING PMOS TRANSISTOR WITH A CHANNEL LAYER AND FORMING METHOD THEREOF

(71) Applicant: CHANGXIN MEMORY TECHNOLOGIES, INC., Anhui (CN)

(72) Inventors: Juanjuan Huang, Hefei (CN); Jie Bai, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 403 days.

(21) Appl. No.: 17/573,764

(22) Filed: Jan. 12, 2022

(65) Prior Publication Data
US 2023/0006071 A1    Jan. 5, 2023

Related U.S. Application Data

(63) Continuation of application No. PCT/CN2021/114015, filed on Aug. 23, 2021.

(30) Foreign Application Priority Data

Jul. 5, 2021    (CN) .......................... 202110759799.2

(51) Int. Cl.
*H01L 21/8238*    (2006.01)
*H01L 21/8234*    (2006.01)
(Continued)

(52) U.S. Cl.
CPC ............. *H01L 21/823807* (2013.01); *H01L 21/823412* (2013.01); *H01L 27/0922* (2013.01);
(Continued)

(58) Field of Classification Search
CPC ......... H01L 21/2807; H01L 21/823412; H01L 21/823462; H01L 21/8238;
(Continued)

(56) References Cited

U.S. PATENT DOCUMENTS

| 2012/0244670 A1* | 9/2012 | Do ...................... H01L 21/2822 257/E21.409 |
| 2013/0207203 A1* | 8/2013 | Tomimatsu ....... H01L 21/28185 257/411 |
| 2017/0186607 A1* | 6/2017 | Kuo .................. H01L 29/66545 |

FOREIGN PATENT DOCUMENTS

CN           100461454 C      2/2009

* cited by examiner

*Primary Examiner* — Cheung Lee
(74) *Attorney, Agent, or Firm* — Kilpatrick Townsend & Stockton LLP (57) ABSTRACT

A semiconductor structure and a forming method thereof are provided. The forming method of the semiconductor structure comprises: providing a substrate comprising a first area for forming a P-channel Metal Oxide Semiconductor (PMOS) transistor and a second area for forming an N-channel Metal Oxide Semiconductor (NMOS) transistor; forming a channel layer on the surface of the first area of the substrate; adjusting the oxidation rate of the channel layer to reduce the difference between the oxidation rate of the channel layer and the oxidation rate of the substrate; and oxidizing the surfaces of the channel layer and the second area of the substrate to form a first transition oxide layer covering the surface of the channel layer and a second transition oxide layer covering the surface of the second area of the substrate.

13 Claims, 9 Drawing Sheets

(51) Int. Cl.
*H01L 27/092* (2006.01)
*H01L 29/786* (2006.01)
*H01L 29/808* (2006.01)

(52) U.S. Cl.
CPC .. *H01L 29/78687* (2013.01); *H01L 29/78696* (2013.01); *H01L 29/808* (2013.01)

(58) Field of Classification Search
CPC ..... H01L 21/823807; H01L 21/823857; H01L 27/092; H01L 27/0922; H01L 29/66477; H01L 29/66484; H01L 29/6659; H01L 29/66666; H01L 29/66674; H01L 29/66893; H01L 29/66916; H01L 29/737; H01L 29/772; H01L 29/78687; H01L 29/78696; H01L 29/808
See application file for complete search history.

SEMICONDUCTOR STRUCTURE HAVING PMOS TRANSISTOR WITH A CHANNEL LAYER AND FORMING METHOD THEREOF

CROSS-REFERENCE TO RELATED APPLICATION

This is a continuation application of International Patent Application No. PCT/CN2021/114015, filed on Aug. 23, 2021, which claims priority to Chinese Patent Application No. 202110759799.2, filed on Jul. 5, 2021 and entitled "Semiconductor Structure and Forming Method Thereof". The disclosures of International Patent Application No. PCT/CN2021/114015 and Chinese Patent Application No. 202110759799.2 are incorporated by reference herein in their entireties.

TECHNICAL FIELD

The present disclosure relates to the technical field of semiconductor manufacturing, and in particular relates to a semiconductor structure and a forming method thereof.

BACKGROUND

A Dynamic Random Access Memory (DRAM) is a semiconductor structure commonly used in electronic devices, such as computers, and is composed of a plurality of storage units. Each of the storage units may usually include a transistor and a capacitor. A gate of the transistor is electrically connected with a word line, a source is electrically connected with a bit line, and a drain is electrically connected with the capacitor. Word line voltage on the word line may control the transistor to be turned on or turned off to read data information stored in the capacitor through the bit line or write the data information in the capacitor.

A P-channel Metal Oxide Semiconductor (PMOS) transistor and an N-channel Metal Oxide Semiconductor (NMOS) transistor are arranged in semiconductor structures, such as the DRAM. Due to the limitation of surface structures and processes of the PMOS transistor and the NMOS transistor, there is a difference in the thickness between a gate dielectric layer in the PMOS transistor and a gate dielectric layer in the NMOS transistor formed synchronously, which affects the electrical performance of the DRAM. With the further miniaturization of the size of the DRAM, the slight difference between the thicknesses of the gate dielectric layers in the PMOS transistor and the NMOS transistor will have a significant impact on the electrical performance of the semiconductor structures, such as the DRAM.

SUMMARY

According to first aspect of the present disclosure, there is provided a method of forming a semiconductor structure, which may include the following operations.

A substrate including a first area for forming a PMOS transistor and a second area for forming an NMOS transistor is provided.

A channel layer is formed on the surface of the first area of the substrate.

The oxidation rate of the channel layer is adjusted to reduce the difference between the oxidation rate of the channel layer and the oxidation rate of the substrate.

The surfaces of the channel layer and the second area of the substrate are oxidized to form a first transition oxide layer covering the surface of the channel layer and a second transition oxide layer covering the surface of the second area of the substrate.

According to second aspect of the present disclosure, there is provided a semiconductor structure, which may include a substrate, a channel layer, a first transition oxide layer and a second transition oxide layer.

The substrate may include a first area for forming a PMOS transistor and a second area for forming an NMOS transistor.

The channel layer is located on the surface of the first area of the substrate, and the oxidation rate of the channel layer is the same as that of the substrate.

The first transition oxide layer is located on the surface of the channel layer.

The second transition oxide layer is located on the surface of the second area of the substrate.

DETAILED DESCRIPTION

The embodiments of a semiconductor structure and a forming method thereof provided by the present disclosure are described in detail below in combination with the drawings.

The embodiment provides a method of forming a semiconductor structure. According to the method of forming the semiconductor structure in the present disclosure, a channel layer is formed in a transistor surface area. By adjusting the oxidation rate of the channel layer and reducing the difference in oxidation rate between the channel layer and a substrate, a first transition oxide layer covering the channel layer and a second transition oxide layer covering the surface of a second area of the substrate may be formed at the same time, and furthermore, the thickness of the first transition oxide layer and the thickness of the second transition oxide layer may be adjusted to be consistent. The first transition oxide layer is configured to be the transition between a subsequently formed first gate dielectric layer and the channel layer, and the second transition oxide layer is configured to be the transition between a subsequently formed second gate dielectric layer and the second area of the substrate. According to the present disclosure, while the interface effect between the substrate and the gate dielectric layer is reduced, the first transition oxide layer and the second transition oxide layer has the same thickness to ensure that electrical performance of a PMOS transistor area is consistent with that of an NMOS transistor area. The forming method of the present disclosure may be applied to the manufacturing process of transistors of various semiconductor devices, such as the manufacturing process of power transistors. A power transistor structure obtained by the forming method of the present disclosure effectively ensures the thickness of the gate dielectric layer, suppresses the gate tunneling leakage current, performs threshold voltage adjustment on a PMOS power transistor area through the channel layer, the first transition oxide layer and the first gate dielectric layer, and improves the electrical performance (such as leakage current) of the semiconductor structure.

Figure 1:
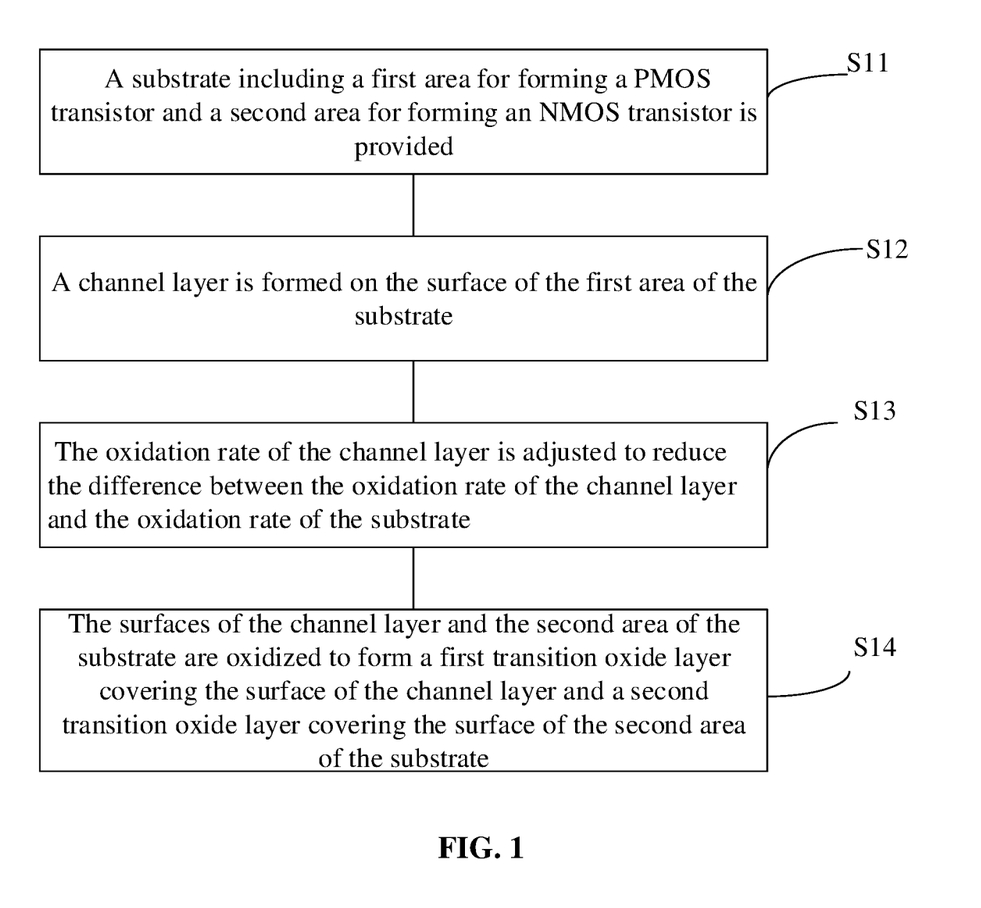
FIG. 1 is a flowchart of a method of forming a semiconductor structure in an embodiment of the present disclosure.

FIG. 1 is a flowchart of a method of forming a semiconductor structure in an embodiment of the present disclosure. FIG. 2A to FIG. 2G are schematic cross section views showing a process of forming a semiconductor structure in an embodiment of the present disclosure. As shown in FIG. 1 and FIG. 2A to FIG. 2G, a method of forming a semiconductor structure in the embodiment may include the following operations.

Figure 2A:
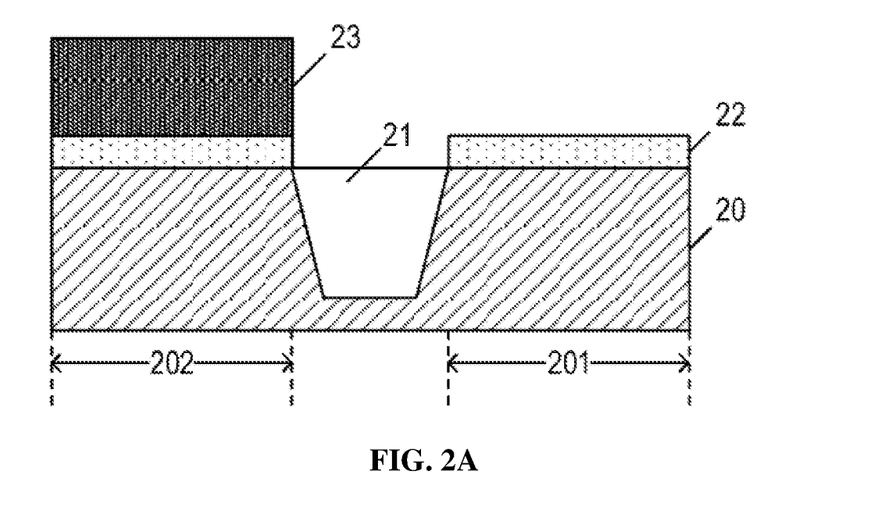
FIG. 2A to FIG. 2G are schematic cross section views showing a process of forming a semiconductor structure in an embodiment of the present disclosure.

At S11, a substrate 20 is provided, the substrate 20 includes a first area 201 for forming a PMOS transistor and a second area 202 for forming an NMOS transistor, as shown in FIG. 2A.

Specifically, the substrate 20 may be, but is not limited to, a silicon substrate. The embodiment takes the silicon substrate 20 as an example. In other examples, the substrate 20 may be a semiconductor substrate which may be, but is not limited to, gallium nitride substrate, gallium arsenide substrate, gallium carbide substrate, silicon carbide substrate or Silicon On Insulator (SOI) substrate. The substrate 20 may include a first area 201 doped with N-type ions, to form a PMOS transistor. The substrate 20 may include a second area 202 doped with P-type ions, to form an NMOS transistor. The first area 201 and the second area 202 are electrically isolated from each other by an isolation structure 21. The material of the isolation structure 21 may be, but is not limited to, an oxide material, such as silicon dioxide.

In some embodiments, both the PMOS transistor and the NMOS transistor are power transistors.

Specifically, the PMOS power transistor and the NMOS power transistor are configured to adjust voltage, leakage current and other parameters of the semiconductor structure. Therefore, when the PMOS power transistor and the NMOS power transistor are formed, by adjusting the oxidation rate of a channel layer, the semiconductor structure with the PMOS power transistor and the NMOS power transistor may be greatly improved in the aspects of convenience of threshold voltage adjustment operation and leakage current, etc.

Figure 2B:
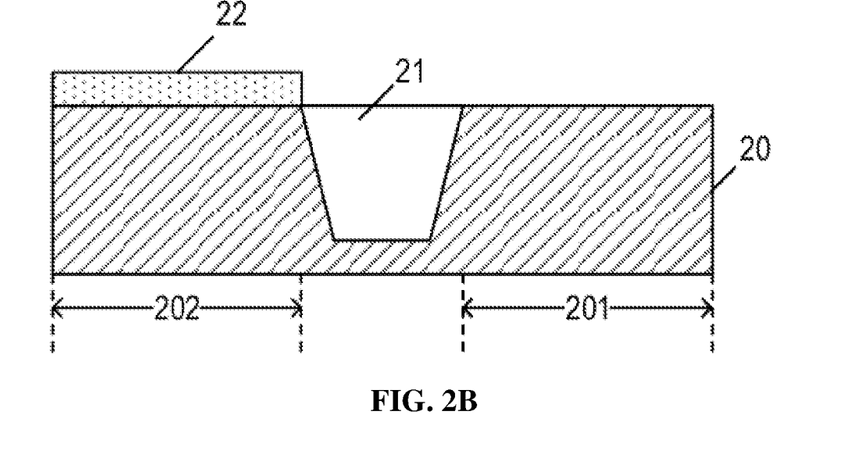
Figure 2C:
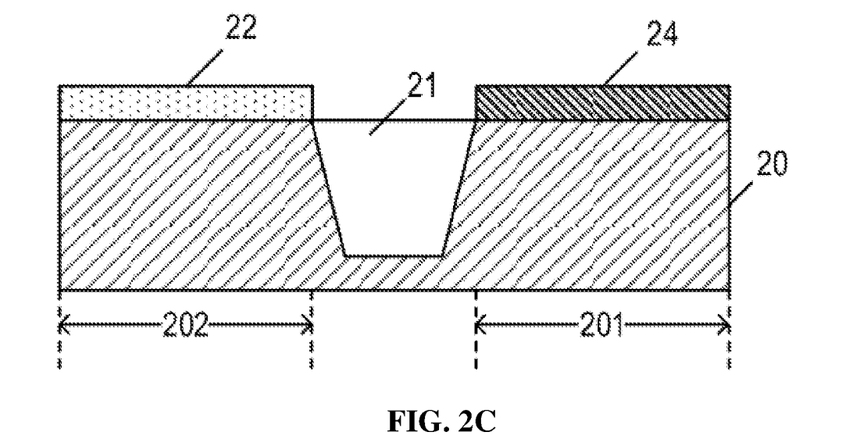

At S12, a channel layer 24 is formed on the surface of the first area 201 of the substrate 20, as shown in FIG. 2C.

In some embodiments, before the channel layer 24 is formed on the surface of the first area 201 of the substrate 20, the method may also include the following operations.

A protective layer 22 covering the surface of the second area 202 of the substrate 20 is formed, as shown in FIG. 2C.

In some embodiments, the formation of the protective layer 22 covering the surface of the second area 202 of the substrate 20 may include the following operations.

The protective layer 22 covering the substrate 20 is formed.

A portion of the protective layer 22 covering the surface of the first area 201 of the substrate 20 is removed.

In some embodiments, the formation of the protective layer 22 covering the substrate 20 may include the following operations.

The protective layer 22 is formed on the surface of the substrate 20 by an In Situ Steam Generation (ISSG) process.

Specifically, after the substrate 20 with the first area 201 and the second area 202 is cleaned, the surface of the substrate 20 is oxidized by the ISSG process to form the protective layer 22 covering the first area 201 and the second area 202. Taking the silicon substrate 20 as an example, the material of the protective layer 22 formed by the ISSG process is silicon dioxide. Then, a first photoresist layer 23 covering the surface of the substrate 20 is formed, and a portion of the first photoresist layer 23 on the first area 201 is removed by an exposure and development process, so that the remaining first photoresist layer 23 only covers the protective layer 22 on the second area 202, and the portion of the protective layer 22 on the first area 201 is exposed, as shown in FIG. 2A. Then, the portion of the protective layer 22 on the first area 201 is removed by an etching process, and, a structure as shown in FIG. 2B is obtained after the remaining first photoresist layer 23 is removed. The protective layer 22 located on the second area 202 is configured to avoid the formation of the channel layer 24 on the second area when the channel layer 24 is grown in the first area subsequently, and further to avoid damage to the second area 202 caused by subsequent processes.

In some embodiments, the thickness of the protective layer 22 is 3 nm~10 nm. For example, the thickness of the protective layer 22 may be 5 nm.

In some embodiments, the formation of the channel layer 24 on the surface of the first area 201 of the substrate 20 may include the following operations.

A channel layer 24 is formed on the surface of the first area 201 of the substrate 20 by an epitaxial growth process, as shown in FIG. 2C.

In the embodiment, the channel layer 24 is formed by epitaxial growth process. Those skilled in the art may also use other processes to form the channel layer 24 according to actual needs. The channel layer 24 is to reduce the interface effect between the surface of the first area 201 of the substrate 20 and the subsequently formed first transition oxide layer, so as to simplify the adjustment operation on the threshold voltage of the PMOS transistor, such as the PMOS power transistor. It should be noted that, the channel layer 24 in the present disclosure is only located in the first area where the PMOS transistor is located, and will not be located in the second area where the NMOS transistor is located, so it will not affect the NMOS transistor, and only adjust the threshold voltage of the PMOS transistor. Furthermore, the channel layer 24 is located at the position of the PMOS power transistor in the first area, so that a channel layer material grows as a channel at the position of the PMOS power transistor, so as to adjust the threshold voltage of the PMOS.

In some embodiments, the material of the substrate 20 is Si, and the material of the channel layer 24 may be SiGe. A carrier in the SiGe layer has a higher electron migration rate, which may allow a better adjustment of the threshold voltage of the PMOS transistor, such as the PMOS power transistor.

At S13, the oxidation rate of the channel layer 24 is adjusted to reduce the difference between the oxidation rate of the channel layer 24 and the oxidation rate of the substrate 20.

Since the material of the substrate 20 is different from that of the channel layer 24, there is a difference between the oxidation rate of the substrate 20 and the oxidation rate of the channel layer 24 even under the same oxidation conditions. Therefore, the embodiment reduces the difference in oxidation rate between the channel layer 24 and the substrate 20 by adjusting the oxidation rate of the channel layer 24. For example, the oxidation rate of the channel layer 24 is adjusted to be equal to that of the substrate 20. Those skilled in the art may select the specific method for adjusting the oxidation rate of the channel layer 24 (such as ion implantation) according to actual needs. The embodiment is not limited thereto, as long as the difference in oxidation rate between the channel layer 24 and the substrate 20 may be reduced.

Figure 2D:
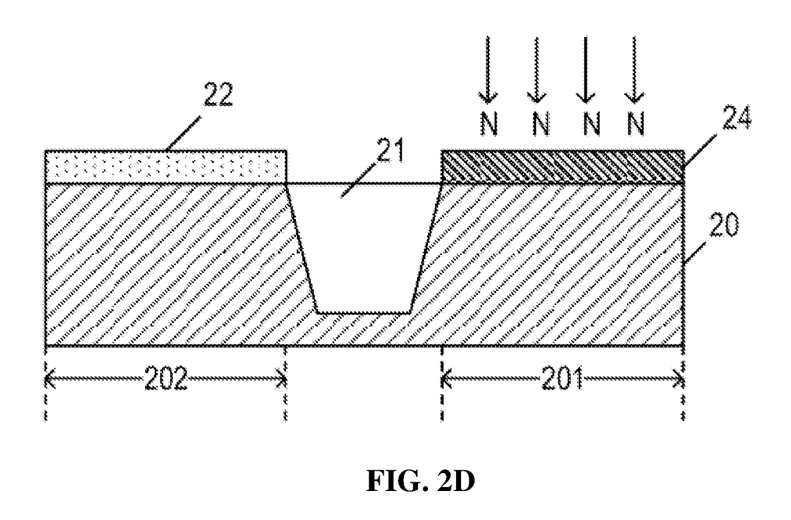
Figure 2E:
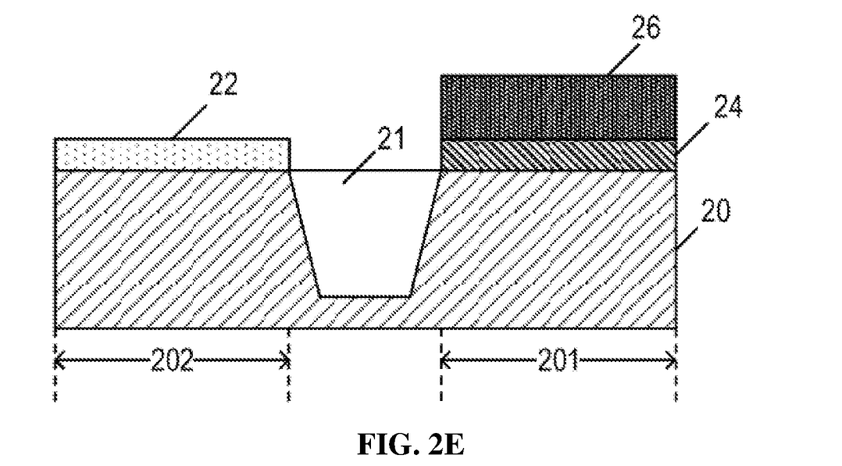

In some embodiments, the adjustment of the oxidation rate of the channel layer 24 may include the following operations.

A nitrogen treatment is performed on the channel layer 24, to reduce the oxidation rate of the channel layer 24, as shown in FIG. 2D.

In the following exemplary description, the material of the substrate 20 is Si and the material of the channel layer 24 is SiGe, for example. Since the oxidation rate of Ge is greater than that of Si, the oxidation rate of the channel layer 24 is higher than that of the substrate 20 before the adjustment. In the embodiment, the channel layer 24 is subjected to the nitrogen treatment, the nitrogen is doped into the channel layer 24 to form a SiGeN layer on the surface of the channel layer 24, so as to effectively reduce the Ge element concentration on the surface of the channel layer 24. Thus the effect of reducing the oxidation rate of the channel layer 24 is achieved.

In the embodiment, before the channel layer 24 is subjected to the nitrogen treatment, the surface of the channel layer 24 may be cleaned to remove particles and a natural oxide layer on the surface of the channel layer 24, to avoid the particles and the natural oxide layer blocking nitrogen atoms from entering the channel layer 24. Therefore, the effect of nitrogen treatment is improved. Herein, when the channel layer 24 is cleaned, and DHF, such as a diluted HF solution, may be used as a cleaning agent. After the channel layer 24 is subjected to the nitrogen treatment, the surface of the nitrided channel layer 24 may also be cleaned again with a DHF solution to avoid the influence of impurities remaining on the surface of the channel layer 24 on the subsequent process.

In some embodiments, the nitrogen treatment of the channel layer 24 may include the following operations.

The channel layer 24 is subjected to the nitrogen treatment by a Remote Plasma Nitridation (RPN) process.

Specifically, the channel layer 24 may be nitrided vertically downward by RPN in the direction shown by the arrow in FIG. 2D. The performance parameters (such as the concentration of nitrogen atoms doped into the channel layer 24) during the nitrogen treatment of the channel layer 24 is monitored, and process parameters in the RPN process, such as the flow of nitrogen source plasma and/or process processing time are adjusted based on the performance parameters. In this way, the nitrogen concentration on the surface of the channel layer 24 may be flexibly adjusted, and thus, the oxidation rate of the channel layer 24 may be adjusted to the value required by the process, for example, the oxidation rate of the channel layer 24 is adjusted to be equal to the oxidation rate of the substrate 20.

Figure 2F:
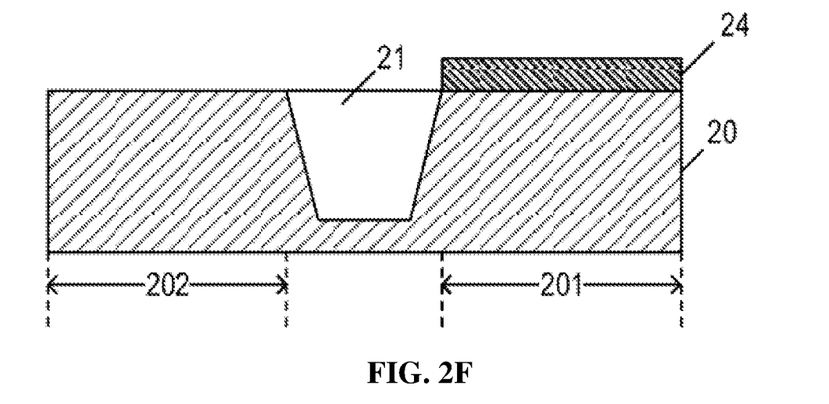
Figure 2G:
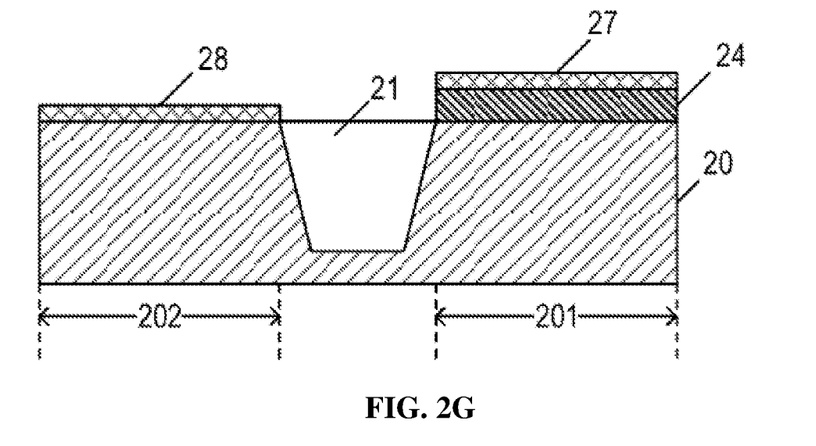

At S14, the surfaces of the channel layer 24 and the second area 202 of the substrate 20 are oxidized, to form a first transition oxide layer 27 covering the surface of the channel layer 24 and a second transition oxide layer 28 covering the surface of the second area 202 of the substrate 20, as shown in FIG. 2G.

In some embodiments, before the surfaces of the channel layer 24 and the second area 202 of the substrate 20 are oxidized, the forming method may further include the following operation.

The protective layer 22 is removed.

Specifically, after the oxidation rate of the channel layer 24 is adjusted, a second photoresist layer 26 covering the surface of the channel layer 24 is formed, and the protective layer 22 on the surface of the second area 202 of the substrate 20 is exposed. Then, the protective layer 22 is removed by an etching process, and the second photoresist layer 26 is stripped to obtain a structure as shown in FIG. 2F. Since defects may occur in the protective layer 22 in the process of epitaxial growth of the channel layer 24 and nitrogen treatment of the channel layer 24, the protective layer 22 needs to be removed to avoid affecting the electrical performance of subsequently formed NMOS transistors.

In some embodiments, the oxidation of the surface of the second area 202 of the substrate 20 and the channel layer 24 may include the following operation.

The surface of the second area 202 of the substrate 20 and the channel layer 24 are oxidized by the ISSG process.

In the following exemplary description, the material of the substrate 20 is Si and the material of the channel layer 24 is SiGe, for example. The surfaces of the channel layer 24 and the second area 202 of the substrate 20 are oxidized by the ISSG process to form the first transition oxide layer 27 covering the surface of the channel layer 24 and the second transition oxide layer 28 covering the surface of the second area 202 of the substrate 20. Since the difference between the oxidation rate of the channel layer 24 and the oxidation rate of the substrate 20 is reduced after the trench layer is adjusted, the difference in thickness between the first transition oxide layer 27 and the second transition oxide layer 28 formed synchronously may be adjusted. For example, the oxidation rate of the channel layer 24 may be adjusted to be consistent with the oxidation rate of the substrate 20, so that the thickness of the first transition oxide layer 27 is consistent with the thickness of the second transition oxide layer. Therefore, in the subsequent electrical test process, the electrical performance of the NMOS and the PMOS may be consistent, the problem of the significant impact caused by slight thickness difference is avoided, and the electrical performance of the semiconductor structure is effectively improved.

In some embodiments, the thickness of the first transition oxide layer 27 is equal to the thickness of the second transition oxide layer 28.

For example, the thickness of the first transition oxide layer 27 and the thickness of the second transition oxide layer 28 may be 0.4~1.2 nm, such as 0.7 nm, 0.8 nm or 1 nm. Those skilled in the art may also adjust the specific values of the thickness of the first transition oxide layer 27 and the thickness of the second transition oxide layer 28 by adjusting the parameters for the ISSG process, such as process time. The reduction of the difference in thickness between the first transition oxide layer 27 and the second transition oxide layer 28 also helps to simplify the adjustment of the specific thickness values of the first transition oxide layer 27 and the second transition oxide layer 28.

In some embodiments, after the first transition oxide layer 27 covering the surface of the channel layer 24 and the second transition oxide layer 28 covering the surface of the second area 202 of the substrate 20 are formed, the forming method may also include the following operation.

A first gate dielectric layer is formed on the surface of the first transition oxide layer 27, and a second gate dielectric layer is formed on the surface of the second transition oxide layer 28 at the same time.

Specifically, the material of the first gate dielectric layer and the material of the second gate dielectric layer may be, such as, materials with high dielectric constant (HK), such as, materials with dielectric constant greater than or equal to 9, so as to effectively improve the gate oxygen thickness, suppress the gate tunneling leakage current and ensure the size reduction of the final semiconductor device. In the present disclosure, the first transition oxide layer 27 may reduce the interface effect between the channel layer 24 and the first gate dielectric layer, and the second transition oxide layer 28 may reduce the interface effect between the second area 202 of the substrate 20 and the second gate dielectric layer. Herein, the material of the first gate dielectric layer and the material of the second gate dielectric layer may be, such as, $HfO_2$, $Al_2O_3$, $HfSiO_z$, HfON, $HfAlO_z$, $ZrO_2$, $ZrSiO_z$, $Ta_2O_5$, $La_2O_3$, $HfLaO_z$, $LaAlO_z$, $LaSiO_z$ or any one or a combination of more than two nitrides or nitrogen oxides of metal or alloy components in the above materials, wherein $0<z\leq1$. Furthermore, the material of the first gate dielectric layer and the material of the second gate dielectric layer may be $HfO_2$, $ZrO_2$ or $Ta_2O_5$.

Figure 3:
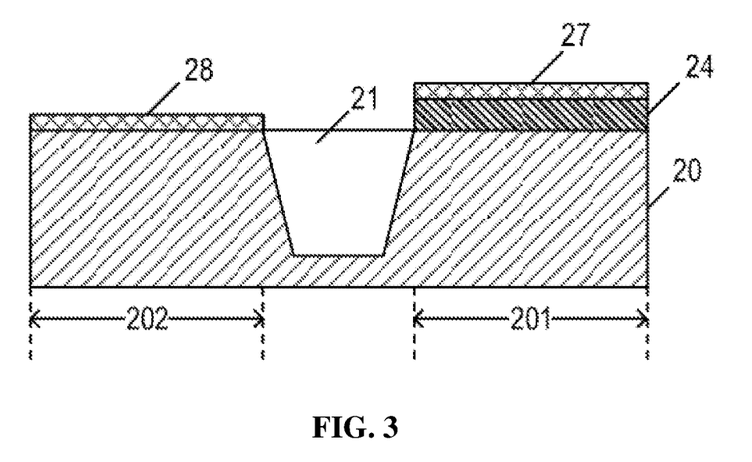
FIG. 3 is a schematic view of a semiconductor structure in an embodiment of the present disclosure.

Moreover, the embodiment also provides a semiconductor structure, and FIG. 3 is a schematic view of the semiconductor structure in the embodiment of the present disclosure. The semiconductor structure according to the embodiment may be formed by the method of forming the semiconductor structure shown in FIG. 1, FIG. 2A-FIG. 2G. As shown in FIG. 3, the semiconductor structure may include a substrate 20, a channel layer 24, a first transition oxide layer 27 and a second transition oxide layer 28.

The substrate 20 may include a first area 201 for forming a PMOS transistor and a second area 202 for forming an NMOS transistor.

The channel layer 24 is located on the surface of the first area 201 of the substrate 20, and the oxidation rate of the channel layer 24 is the same as that of the substrate 20.

The first transition oxide layer 27 is located on the surface of the channel layer 24.

The second transition oxide layer 28 is located on the surface of the second area 202 of the substrate 20.

In some embodiments, the material of the channel layer 24 may include SiGe and a doped element for reducing the oxidation rate of SiGe.

In some embodiments, the doped element is nitrogen.

Herein, the doped element may be only located on the surface of the channel layer 24. Alternatively, the doped element may also be evenly distributed in the whole the channel layer 24.

In some embodiments, the thickness of the first transition oxide layer 27 is equal to the thickness of the second transition oxide layer 28.

For example, the thickness of the first transition oxide layer 27 and the thickness of the second transition oxide layer 28 may be 0.4~1.2 nm, such as 0.7 nm, 0.8 nm or 1 nm.

In some embodiments, the semiconductor structure may also include a first gate dielectric layer and a second gate dielectric layer.

The first gate dielectric layer covers the surface of the first transition oxide layer 27.

The second gate dielectric layer covers the surface of the second transition oxide layer 28.

In some embodiments, the material of the first gate dielectric layer is the same as that of the second gate dielectric layer.

In some embodiments, both the PMOS transistor and the NMOS transistor are power transistors.

According to the semiconductor structure and the forming method thereof according to the embodiment, by adjusting the oxidation rate of the channel layer and reducing the difference in oxidation rate between the channel layer and the substrate, the first transition oxide layer covering the channel layer and the second transition oxide layer covering the surface of the second area of the substrate may be formed at the same time, and furthermore, the thickness of the first transition oxide layer and the thickness of the second transition oxide layer may be adjusted to be consistent, which effectively improves the electrical performance of the semiconductor structure.

The above is only the preferred implementation mode of the present disclosure. It should be noted that ordinary technicians in the technical field may also make several improvements and refinements without departing from the principles of the present disclosure, and these improvements and refinements should also be regarded as the scope of protection of the present disclosure.

The invention claimed is:

1. A method of forming a semiconductor structure, comprising:
    providing a substrate comprising a first area for forming a P-channel Metal Oxide Semiconductor (PMOS) transistor and a second area for forming an N-channel Metal Oxide Semiconductor (NMOS) transistor;
    forming a channel layer on a surface of the first area of the substrate;
    adjusting an oxidation rate of the channel layer to reduce a difference between the oxidation rate of the channel layer and an oxidation rate of the substrate; and
    oxidizing surfaces of the channel layer and the second area of the substrate to form a first transition oxide layer covering the surface of the channel layer and a second transition oxide layer covering the surface of the second area of the substrate; and,
    wherein after forming the first transition oxide layer covering the surface of the channel layer and the second transition oxide layer covering the surface of the second area of the substrate, the method further comprises:
    forming a first gate dielectric layer on a surface of the first transition oxide layer, and forming a second gate dielectric layer on the surface of the second transition oxide layer at the same time.

2. The method of forming the semiconductor structure according to claim 1, wherein before forming a channel layer on a surface of the first area of the substrate, the method further comprises:
    forming a protective layer covering the surface of the second area of the substrate.

3. The method of forming the semiconductor structure according to claim 2, wherein forming the protective layer covering the surface of the second area of the substrate comprises:
    forming the protective layer covering the substrate; and
    removing a portion of the protective layer covering the surface of the first area of the substrate.

4. The method of forming the semiconductor structure according to claim 2, wherein a material of the substrate is Si, and a material of the channel layer is SiGe.

5. The method of forming the semiconductor structure according to claim 4, wherein adjusting the oxidization rate of the channel layer comprises:
    performing a nitrogen treatment on the channel layer to reduce the oxidation rate of the channel layer.

6. The method of forming the semiconductor structure according to claim 5, wherein performing a nitrogen treatment on the channel layer comprises:
    nitriding the channel layer by a Remote Plasma Nitridation (RPN) process.

7. The method of forming the semiconductor structure according to claim 2, wherein before oxidizing the surfaces of the channel layer and the second area of the substrate, the method further comprises:
    removing the protective layer.

8. The method of forming the semiconductor structure according to claim 1, wherein oxidizing the surfaces of the channel layer and the second area of the substrate comprises:
  oxidizing the surfaces of the channel layer and the second area of the substrate by an In Situ Steam Generation (ISSG) process.

9. The method of forming the semiconductor structure according to claim 1, wherein both the PMOS transistor and the NMOS transistor are power transistors.

10. A semiconductor structure, comprising:
  a substrate comprising a first area for forming a P-channel Metal Oxide Semiconductor (PMOS) transistor and a second area for forming an N-channel Metal Oxide Semiconductor (NMOS) transistor;
  a channel layer located on a surface of the first area of the substrate, an oxidation rate of the channel layer being the same as that of the substrate;
  a first transition oxide layer located on a surface of the channel layer;
  a second transition oxide layer located on a surface of the second area of the substrate;
  a first gate dielectric layer covering a surface of the first transition oxide layer; and
  a second gate dielectric layer covering a surface of the second transition oxide layer.

11. The semiconductor structure according to claim 10, wherein a material of the channel layer comprises SiGe and a doped element for reducing the oxidation rate of SiGe.

12. The semiconductor structure according to claim 11, wherein the doped element is nitrogen.

13. A semiconductor structure, comprising:
  a substrate comprising a first area for forming a P-channel Metal Oxide Semiconductor (PMOS) transistor and a second area for forming an N-channel Metal Oxide Semiconductor (NMOS) transistor;
  a channel layer located on a surface of the first area of the substrate, an oxidation rate of the channel layer being the same as that of the substrate;
  a first transition oxide layer located on a surface of the channel layer; and
  a second transition oxide layer located on a surface of the second area of the substrate; and,
  wherein both the PMOS transistor and the NMOS transistor are power transistors.

* * * * *